(12) United States Patent
Stowell et al.

(10) Patent No.: US 7,993,733 B2
(45) Date of Patent: Aug. 9, 2011

(54) INDEX MODIFIED COATING ON POLYMER SUBSTRATE

(75) Inventors: Michael W. Stowell, Loveland, CO (US); Manuel D. Campo, Hanau (DE)

(73) Assignee: Applied Materials, Inc., Santa Clara, CA (US)

( * ) Notice: Subject to any disclaimer, the term of this patent is extended or adjusted under 35 U.S.C. 154(b) by 33 days.

(21) Appl. No.: 12/070,660

(22) Filed: Feb. 20, 2008

(65) Prior Publication Data

US 2009/0208715 A1 Aug. 20, 2009

(51) Int. Cl.
*B32B 7/02* (2006.01)
*H05H 1/46* (2006.01)

(52) U.S. Cl. ........ 428/213; 428/220; 428/212; 427/475; 427/561; 427/569; 427/162; 427/402

(58) Field of Classification Search .......... 428/220, 428/213, 447; 427/575, 561, 569, 162, 402
See application file for complete search history.

(56) References Cited

U.S. PATENT DOCUMENTS

| | | | |
|---|---|---|---|
| 4,185,252 A | | 1/1980 | Gerlach |
| 4,374,158 A | * | 2/1983 | Taniguchi et al. ............ 427/536 |
| 4,545,646 A | * | 10/1985 | Chern et al. .................... 359/569 |
| 4,927,704 A | * | 5/1990 | Reed et al. ...................... 428/221 |
| 5,242,566 A | | 9/1993 | Parker |
| 5,527,391 A | | 6/1996 | Echizen et al. |
| 5,643,638 A | * | 7/1997 | Otto et al. ...................... 427/569 |
| 5,672,211 A | | 9/1997 | Mai et al. |
| 5,688,382 A | | 11/1997 | Besen et al. |
| 5,749,966 A | | 5/1998 | Shates |
| 5,965,246 A | | 10/1999 | Guiselin et al. |
| 5,990,984 A | * | 11/1999 | Meredith et al. .............. 348/834 |
| 6,096,389 A | | 8/2000 | Kanai |
| 6,121,930 A | | 9/2000 | Grangeat et al. |
| 6,290,825 B1 | | 9/2001 | Fu |

(Continued)

FOREIGN PATENT DOCUMENTS

JP 05-263223 A 10/1993

(Continued)

OTHER PUBLICATIONS

Zajickova, Deposition of Protective Coatings in RF Organosilicon Discharges, Jan. 31, 2007, Institute of Physics Publishing, pp. 123-132.*

(Continued)

*Primary Examiner* — Angela Ortiz
*Assistant Examiner* — Tahseen Khan
(74) *Attorney, Agent, or Firm* — Townsend and Townsend and Crew, LLP

(57) ABSTRACT

The invention includes the structure of a multilayer protective coating, which may have, among other properties, scratch resistance, UV absorption, and an effective refractive index matched to a polymer substrate such as polycarbonate. Each layer may contain multiple components consisting of organic and inorganic materials. The multilayer protective coating includes interleaved organic layers and inorganic layers. The organic layers may have 20% or more organic compounds such as $SiO_xC_yH_z$. The inorganic layers may have 80% or more inorganic materials, such as $SiO_2$, $SiO_xN_y$, and ZnO, or mixtures thereof. Each layer of the multilayer protective coating is a micro layer and may have a thickness of 5 angstroms or less in various embodiments. The multilayer protective coating may contain in the order of hundreds or thousands of micro layers, depending upon the design requirement of applications. In each micro layer, the components may have substantially continuous variations in concentration.

35 Claims, 22 Drawing Sheets

U.S. PATENT DOCUMENTS

| | | |
|---|---|---|
| 6,306,265 B1 | 10/2001 | Fu et al. |
| 6,357,385 B1 | 3/2002 | Ohmi et al. |
| 6,424,298 B1 | 7/2002 | Nishikawa et al. |
| 6,620,296 B2 | 9/2003 | Gogh et al. |
| 6,805,779 B2 | 10/2004 | Chistyakov |
| 6,806,651 B1 | 10/2004 | Chistyakov |
| 6,853,142 B2 | 2/2005 | Chistyakov |
| 6,868,800 B2 | 3/2005 | Moroz |
| 6,896,773 B2 | 5/2005 | Chistyakov |
| 7,166,661 B2 | 1/2007 | Kuramoto et al. |
| 7,459,182 B2 * | 12/2008 | Xiong et al. ............ 427/214 |
| 7,815,982 B2 * | 10/2010 | Iwanaga ............... 428/1.26 |
| 2003/0072932 A1 | 4/2003 | Gandon |
| 2003/0168172 A1 | 9/2003 | Glukhoy |
| 2003/0209422 A1 | 11/2003 | Wang et al. |
| 2004/0011466 A1 | 1/2004 | Matsumoto et al. |
| 2004/0265507 A1 * | 12/2004 | Xiong et al. ............ 427/561 |
| 2005/0211170 A1 | 9/2005 | Hanawa et al. |
| 2006/0078717 A1 * | 4/2006 | Yamaya et al. .......... 428/212 |
| 2006/0166515 A1 | 7/2006 | Karim et al. |
| 2006/0191478 A1 | 8/2006 | Gondhalekar et al. |
| 2006/0208634 A1 * | 9/2006 | Schaepkens et al. ....... 313/506 |
| 2006/0240232 A1 * | 10/2006 | Faris ................... 428/447 |
| 2007/0045103 A1 | 3/2007 | Lee et al. |
| 2007/0048509 A1 * | 3/2007 | Yoneyama et al. ........ 428/212 |
| 2007/0080056 A1 | 4/2007 | German et al. |
| 2007/0218264 A1 * | 9/2007 | Gueneau et al. .......... 428/220 |
| 2008/0118734 A1 * | 5/2008 | Goodwin et al. .......... 428/221 |
| 2008/0226924 A1 * | 9/2008 | Okubo et al. ............ 428/426 |
| 2009/0232977 A1 * | 9/2009 | Morinaga et al. ......... 427/162 |

FOREIGN PATENT DOCUMENTS

| | | |
|---|---|---|
| JP | 06-017247 A | 1/1994 |
| JP | 06-102827 B2 | 12/1994 |
| JP | 08009780 B2 | 1/1996 |
| JP | 2002-004044 A | 1/2002 |
| JP | 2005-508728 A | 4/2005 |
| JP | 2007-516347 A | 6/2007 |
| KR | 10-2007-0112210 A | 11/2007 |
| WO | WO 99/35302 A1 | 7/1999 |
| WO | WO 2007-096482 A2 | 8/2007 |

OTHER PUBLICATIONS

Author Unknown, "Ultrafine Zinc Oxide," Sumitomo Osaka Cement Co., Ltd., 2 pages, no date, p. 1-p. 2.

Author Unknown, "Zinc Oxide Profile," obtained on Oct. 15, 2007 from website http://www.mountainroseherbs.com/learn/zinc_oxide.php, 2 pages, p. 1-p. 2, Mar. 3, 2005.

Dickson, M. et al., "Radial uniformity of an external-coil ionized physical vapor deposition source," J. Vac. Sci. Technol. B 16(2), Mar./Apr. 1998, pp. 523-531, p. 523-p. 531.

Erlat, Ahmet G., et al., "Morphology and gas barrier properties of thin SiOx coatings and polycarbonate: Correlations with plasma-enhanced chemical vapor deposition conditions," J. Mater. Res., vol. 15, No. 3, Mar. 2000, pp. 704-717, p. 704-p. 717.

Tomar, V.K., et al., "Depositions and characterization of SiOn using HMDS for Photonics applications," abstract, obtained on Oct. 16, 2007 from website http://www.iop.org/EJ/abstract/0268-1242/22/2/008, 2 pages, p. 1-p. 2 (Feb. 2007).

Zajickova, L. et al., "Deposition of protective coatings in rf organosilicon discharges," abstract, obtained on Oct. 16, 2007 on website http://www.iop.org.EJ/abstract/0963-0252/16/1/S14, 2 pages, p. 1-p. 2 (Jan. 2007).

U.S. Appl. No. 12/050,373, filed Mar. 18, 2008, Stowell et al.
U.S. Appl. No. 12/077,375, filed Mar. 19, 2008, Stowell et al.
U.S. Appl. No. 12/115,717, filed May 6, 2008, Stowell et al.
U.S. Appl. No. 12/120,391, filed May 14, 2008, Stowell et al.
U.S. Appl. No. 12/238,685, filed Sep. 26, 2008, Stowell.
U.S. Appl. No. 12/238,664, filed Sep. 26, 2008, Stowell.

Wikipedia, "Microstrip", obtained online at http://en.wikipedia.org/wiki/Microstrip on Jan. 25, 2008, 5 pages, p. 1-p. 5.

Wikipedia, "Microwave", obtained online at http://en.wikipedia.org/wiki/Microwave on Dec. 13, 2007, 7 pages, p. 1-p. 5.

PCT International Search Report and Written Opinion mailed Sep. 15, 2009; International Application No. PCT/US2009/034551, 12 pages.

PCT International Search Report and Written Opinion mailed Sep. 25, 2009; International Application No. PCT/US2009/035325, 10 pages.

PCT International Search Report and Written Opinion mailed Nov. 4, 2009; International Application No. PCT/US2009/044213, 12 pages.

PCT International Search Report and Written Opinion mailed Dec. 18, 2009; International Application No. PCT/US2009/042891; 10 pages.

PCT International Search Report and Written Opinion mailed Jan. 12, 2010; International Application No. PCT/US2009/043986; 10 pages.

* cited by examiner 400  410  414  412

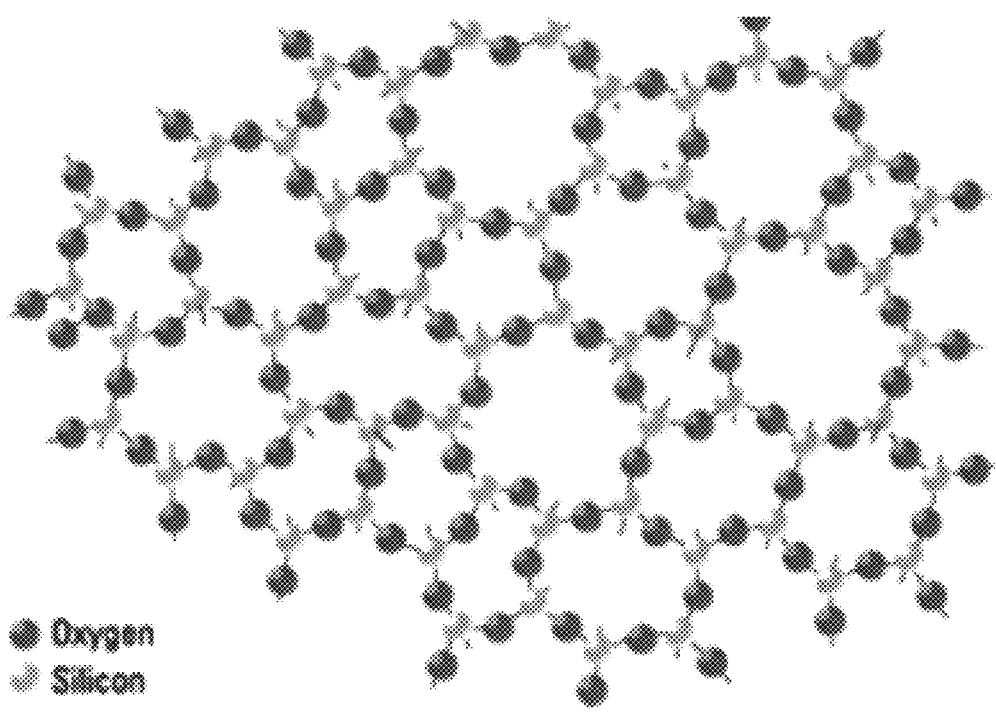
Fig. 8D (in color)

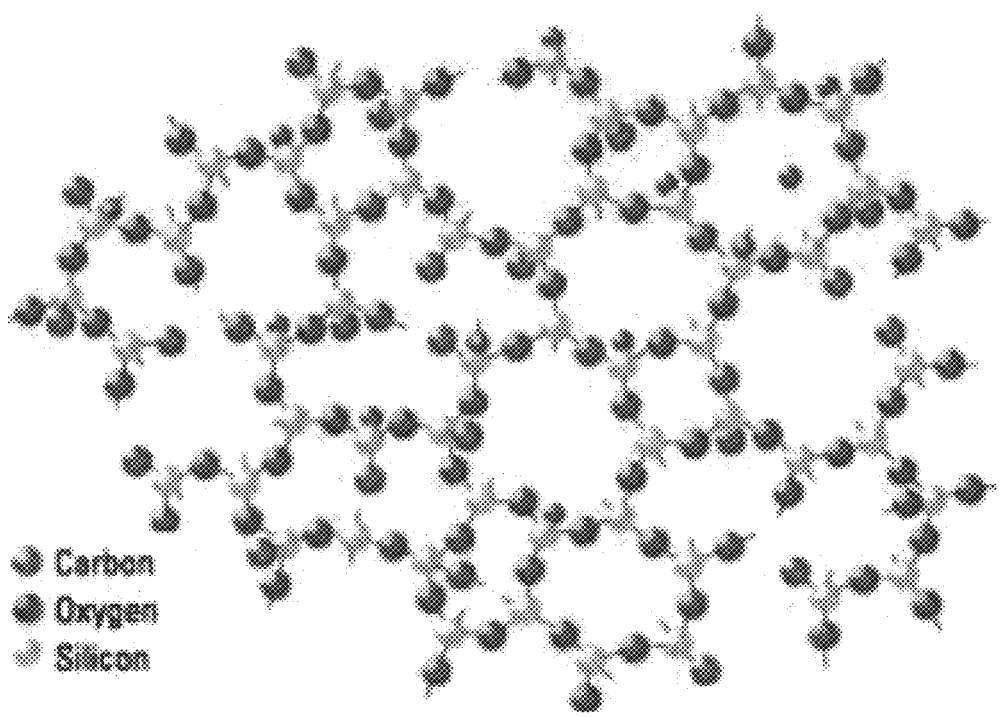
Fig. 8E (in color)

INDEX MODIFIED COATING ON POLYMER SUBSTRATE

BACKGROUND OF THE INVENTION

Polycarbonate has been used extensively in the automotive industry as a replacement to glass components. Sun roofs, windows, and lens covers are the primary components presently being made of polycarbonate. However, polycarbonate is susceptible to scratching and degradation from UV light. Hence, there is a need for developing a highly transparent protective coating for both scratch resistance and UV light absorption.

A lacquer based coating can be sprayed on polycarbonate and then thermally cured to provide a hard coating that also blocks UV light. Such a coating is typically in the range of 2-10 µm thick. The cost associated with this lacquer based technology is so high that it limits applications.

Another coating method is to first form a soft UV blocking layer benzyl phenon on a polycarbonate substrate. Next, a hard organo-silicon coating can be formed on the coated polycarbonate substrate by using plasma enhanced chemical vapor deposition (PECVD). The two-layer coating is normally 2-10 µm thick. Such an organo-silicon coating provides a much harder coating than the lacquer based system. However, the UV blocking layer beneath the organo-silicon coating is degraded from UV light attack over time. As a result of consumption of UV absorbers, the organo-silicon coating will typically shrink or crack after about 3000 to 5000 hours, which will shorten the lifetime of the scratch resistance coating. Therefore, there is a remaining need in the art to provide methods and systems for developing an endurable and transparent protective coating for UV blocking and scratch resistance.

BRIEF SUMMARY OF THE INVENTION

Embodiments of the invention makes use of pulse modulation techniques in a microwave plasma chemical vapor deposition (MPCVD) process to form a protective coating on a polymer substrate such as polycarbonate. The coating may have a matched effective refractive index to the polymer substrate and is able to provide protection for both scratch resistance and UV absorption.

Embodiments of the invention include the structure of a multilayer protective coating, which may have, among other properties, scratch resistance, UV absorption, and an effective refractive index matched to a polymer substrate such as polycarbonate. Each layer may contain multiple components consisting of organic and inorganic materials. The multilayer protective coating includes interleaved organic layers and inorganic layers. The organic layers may have 60% or more organic polymers such as $SiO_xC_yH_z$. The inorganic layers may have 60% or more inorganic materials, such as $SiO_2$, $SiO_xN_y$, and ZnO, or mixtures thereof. Each layer of the multilayer protective coating is a micro layer and may have a thickness of 5 angstroms or less in various embodiments. The multilayer protective coating may contain in the order of hundreds or thousands of micro layers, depending upon the design requirement of applications. In each micro layer, the components may have substantially continuous variations in concentration.

Embodiments of the invention also include the structure of a single gradient layer protective coating, which may have, among other properties, scratch resistance, UV absorption, and an effective refractive index matched to a polymer substrate such as polycarbonate. The single gradient layer may include multiple components of inorganic and organic materials, such as $SiO_2$, $SiO_xN_y$, ZnO, and organo polymer (e.g. $SiO_xC_yH_z$), or mixtures thereof. The multiple components may be mixed to have substantially continuous variations in concentrations of the components. The single gradient layer may comprise 60% or higher concentration of dense components such as $SiO_2$ near the top and may comprise 60% or higher concentration of organo-silicon near the substrate surface.

Embodiments of the invention still further pertain to pulse modulation techniques in MPCVD for forming a protective coating with new properties in a single plasma process. In one set of the embodiments, a substrate processing system is provided. A housing defines a processing chamber. A coaxial plasma line source is located inside the processing chamber. A substrate is disposed inside the processing chamber. A gas-delivery system is configured to introduce gases into the substrate processing chamber. A controller controls the plasma-generating system and the gas-delivery system. The controller may also use pulse modulation techniques to control plasma radical density.

In different embodiments of the invention, examples of the precursor gases comprise silicon-containing precursors such as hexamethyldisiloxane (HMDSO) and hexamethyldilazane (HMDS), and the like, zinc-containing precursors such as diethylzinc (DEZ), oxidizing precursors such as oxygen or ozone, and nitrogen-containing precursors such as ammonia ($NH_3$). The reaction of HMDSO and an oxidizing precursor can form $SiO_2$ and a hard cross-linked polymer $SiO_xC_yH_z$. Moreover, the reaction of HMDS, a nitrogen-containing precursor and an oxidizing precursor can form $SiO_xN_y$ and organo-silicon. Furthermore, the decomposition of DEZ in the presence of oxidizing precursors may form ZnO.

In another set of embodiments of the invention, examples of modulation techniques comprise pulse width modulation and pulse amplitude modulation. Other modulation techniques comprise frequency modulation, pulse position modulation, and the like. By using the modulation techniques, the microwave power can be turned on and off to control the total radical density to alter the chemical composition of the layers formed on a polymer substrate. The layers may be a single gradient layer or a multilayer with varying properties in the micro layers.

Additional embodiments and features are set forth in part in the description that follows, and in part will become apparent to those skilled in the art upon examination of the specification or may be learned by the practice of the invention. A further understanding of the nature and advantages of the present invention may be realized by reference to the remaining portions of the specification and the drawings.

BRIEF DESCRIPTION OF THE DRAWINGS

FIGS. 8B-8E provide the FTIR spectra of polymeric $SiO_2$ film and ceramic $SiO_2$ from $HMDSO/O_2$ by microwave plasma assisted CVD.

DETAILED DESCRIPTION OF THE INVENTION

Figure 1A:
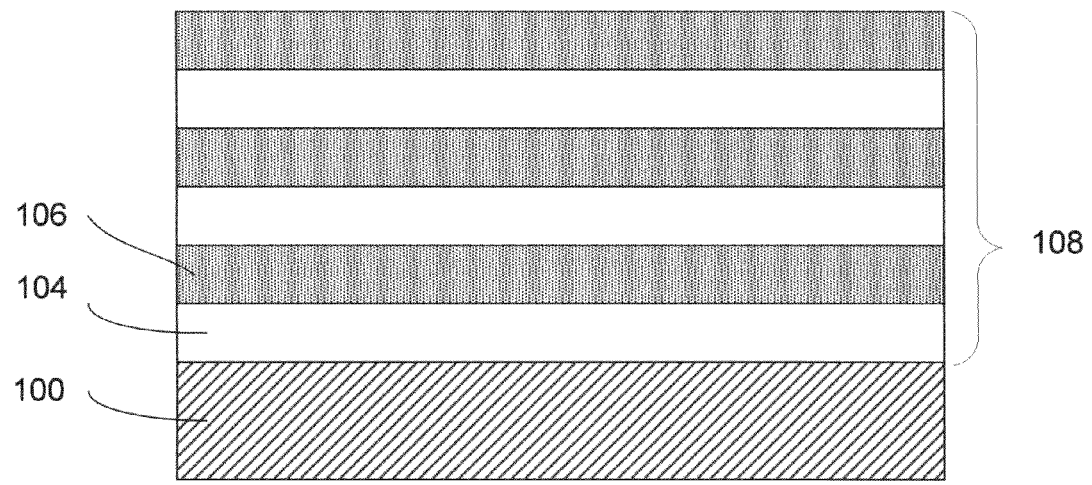
FIG. 1A is a schematic cross-sectional drawing of a multilayer protective coating on a polymer substrate.

1. Overview of Microwave Plasma CVD Technology

Conventional thermal CVD processes supply reactive gases to a substrate surface where heat-induced chemical reactions take place to produce a desired film. Precursors contain one or more of the atoms or molecules necessary to form films of organic or inorganic material with desired properties. At low temperature or high vacuum condition, the reaction rate is below the gas arriving rate, so that film uniformity depends on temperature uniformity across the substrate and from substrate to substrate. Deposition rate is also controlled by temperature in conventional thermal CVD.

Plasma-enhanced CVD (PECVD) techniques promote excitation and/or dissociation of the reactant gases by application of radio-frequency (RF) energy to a reaction zone near the substrate surface, thereby creating a plasma. The high reactivity of the species in the plasma reduces the energy required for a chemical reaction to take place, and thus lowers the temperature required for such CVD processes when compared with conventional thermal CVD processes. These advantages may be further exploited by high density plasma CVD (HDPCVD) techniques, in which a dense plasma is formed at low vacuum pressure so that plasma species are even more reactive.

Furthermore, microwave-plasma assisted CVD (MPCVD) has been developed to achieve higher plasma densities (e.g. $10^{11}$ ions/cm$^3$) and higher deposition rate, as a result of improved power coupling and absorption at 2.45 GHz when compared to typical radio frequency (RF) coupled plasma sources at 13.56 MHz. The main drawback of the RF plasma is that a large portion of the input power is dropped across the plasma sheath (dark space). By using microwave plasma, a narrow plasma sheath is formed and more power would be absorbed by the plasma for creation of radical and ion species, which would increase the plasma density and reduce collision broadening of the ion energy distribution to achieve a narrow energy distribution.

Microwave plasma also has other advantages such as lower ion energies with a narrow energy distribution. For instance, microwave plasma would have low ion energy of 1-25 eV, which would lead to lower damage when compared to RF plasma. In contrast, standard planar discharge would result in high ion energy of 100 eV with a broader distribution in ion energy, which would lead to higher damage, as the ion energy exceeds the binding energy for most materials of interest. This ultimately inhibits the formation of high quality crystalline thin films through introduction of intrinsic defects. With low ion energy and narrow energy distribution, microwave plasma would help in surface modification and improve coating properties.

In addition, lower substrate temperature (e.g. lower than 200° C., for instance at 100° C.) is achieved in MPCVD, as increased plasma density at lower ion energy would help reduce defect density of films. Such a lower temperature would allow better microcrystalline growth in kinetically limited conditions. Also, it may require pressure greater than 50 mtorr to maintain self-sustained discharge for PECVD, as plasma becomes unstable at pressure lower than 50 mtorr. The microwave plasma technology allows the pressure to range from $10^{-6}$ torr to 1 atmospheric pressure.

Furthermore, there may be a reduction in impurities of the deposited coating, as there is no internal metallic electrodes for microwave discharges and thus the contamination of plasma and deposited films may be reduced.

In the past, the main drawback associated with microwave source technology in the vacuum coating industry was the scale up from small wafer processing to very large area processing. Recent advances in microwave reactor design have been able to overcome these problems. Arrays of new coaxial plasma line sources have been developed to deposit ultra large area coating (greater than 1 m$^2$) at high deposition rate to form dense and thick films (e.g. 5-10 μm thick).

An advanced pulsing technique has been developed to control the microwave power for generating plasma, and thus to control the plasma density and plasma temperature. One of the advantages of the advanced pulsing technique is to minimize the thermal load disposed over substrate. This feature is very important when the substrate has low melting point or low glass transition temperature, such as polymer substrate. The advanced pulsing technique allows high power pulsing into plasma with off times in between pulses, which reduces the need for continuous heating of the substrate. Radical density may be controlled by process conditions including power level, pulse frequency, and duty cycle of the source. The radical density may be preferably affected by the average and peak power level into the plasma discharge. Film properties may be varied by changing radical species and radical density. To promote good adhesion to the substrate, composition of the organic film should be finely controlled, preferably in the form of a gradient across the film thickness. This desired gradient structure may be achieved by using the advanced pulse modulation technique in MPCVD.

2. Exemplary Multilayer Protective Coating

Zinc oxide is a stable inorganic crystal. It is commonly known for use as one of the most powerful whitening pigments. Zinc oxide is also found in sunscreen for UV light absorption, and is more stable than organic UV absorbers. The challenge of using zinc oxide for a highly transparent UV protective coating is the high refractive index of zinc oxide which is approximately 1.9-2.0. The effective refractive index of the protective coating may be reduced by alloying zinc oxide with other components of lower refractive index to match with substrate material (e.g. polycarbonate having a refractive index of approximately 1.6). FIG. 1A shows a multilayer protective coating 108 on substrate 100. Layer 104 contains 60% or more inorganic components. Layer 106 contains 60% or more organic components. The two layers 104, 106 are interleaved. Each of the micro layers 104, 106 may be as thin as 5 Å or less. The multilayer protective coating 108 may contain in the order of hundreds or thousands of micro layers 104, 106. The substrate 100 comprises a polymer such as polycarbonate. The multilayer protective coating 108 may provide protection for scratch resistance, UV light absorption and an effective refractive index matched to the substrate 100.

Figure 1B:
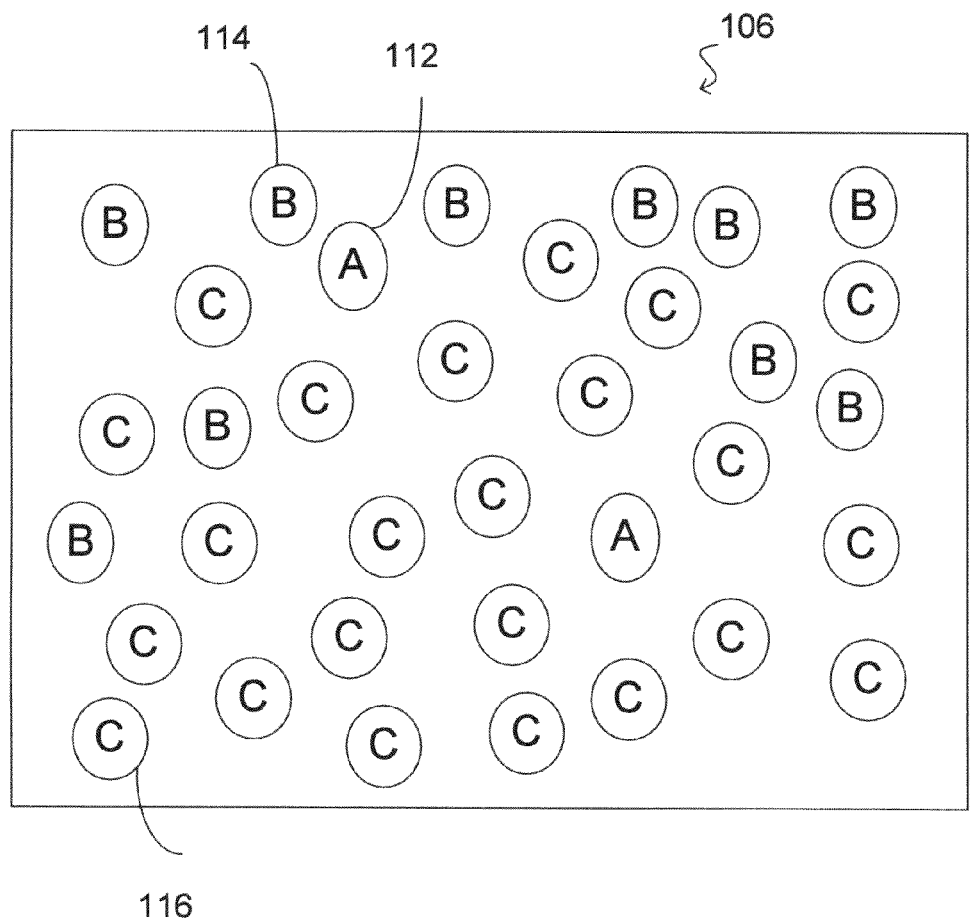
FIGS. 1B-1C are schematic cross-sectional drawings of a detailed gradient structure of layers 104, 106 of the multilayer protective coating.

FIG. 1B illustrates more details about micro layer 106. Three components are shown in FIG. 1B, where component C 116 comprises inorganic material, such as $SiO_2$, $SiO_xN_y$. Component B 114 comprise also inorganic material, such as ZnO. Component A 112 comprises organic material, such as organo-silicon polymer (e.g. $SiO_xC_yH_z$). Note that the concentration of components B 114 and C 116 are higher than component A 112 in the micro layer 106. In general, the micro layer 106 may comprise more than 3 components as long as the total concentration of all inorganic components exceed 60%. FIG. 1B further demonstrates that there may be a substantial variation in concentration of the components in the micro layer 106.

Figure 1C:
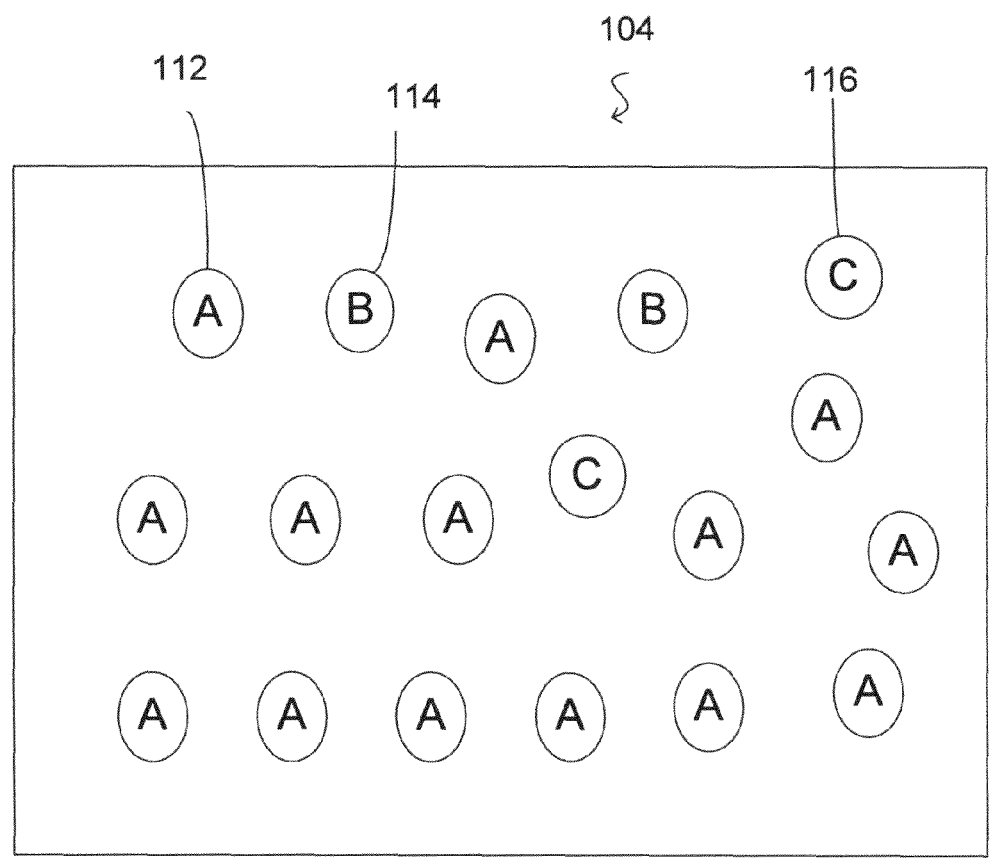

FIG. 1C illustrates more details about micro layer 104. Similar to FIG. 1B, micro layer 104 comprises three components. However, micro layer 104 contains more component A 112 than components B 114 and C 116, where component A 112 comprises organic material, components B 114 and C 116 comprise inorganic materials. In general, the micro layer 104 may comprise more than 3 components as long as the organic components exceed 60%. FIG. 1C further demonstrates that there may be a substantial variation in concentration of the components in the micro layer 104.

Figure 1D:
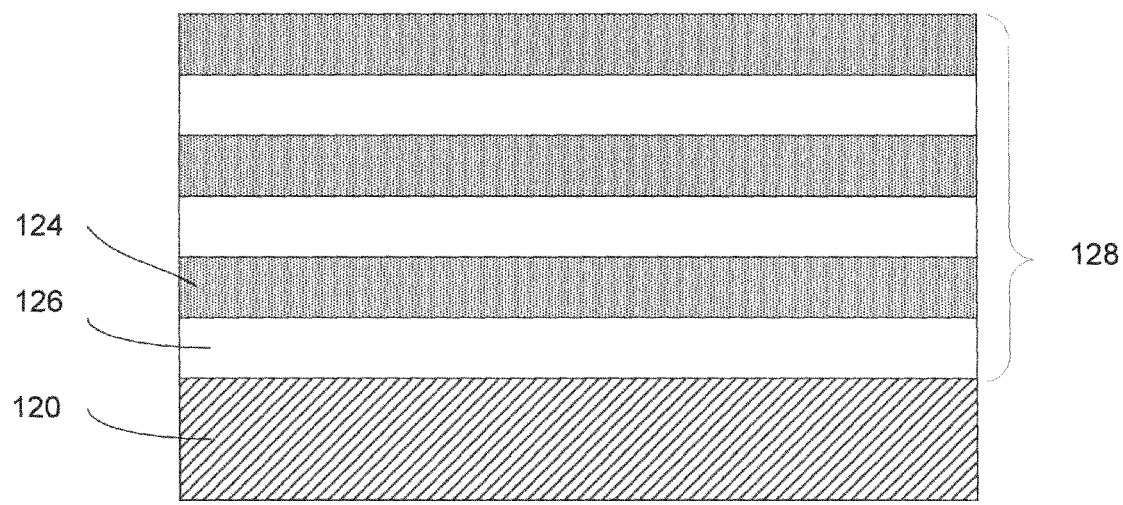
FIG. 1D is another schematic cross-sectional drawing of a multilayer protective coating on a polymer substrate.

Another embodiment of a multilayer protective coating 128 is illustrated in FIG. 1D. Conversely from FIG. 1a, micro layer 124 is first disposed over a polymer substrate 120. Micro layer 126 is then disposed over micro layer 124. The micro layers 124 and 126 are interleaved to form the multilayer protective coating 128.

3. Exemplary Single Layer Protective Coating

Figure 2:
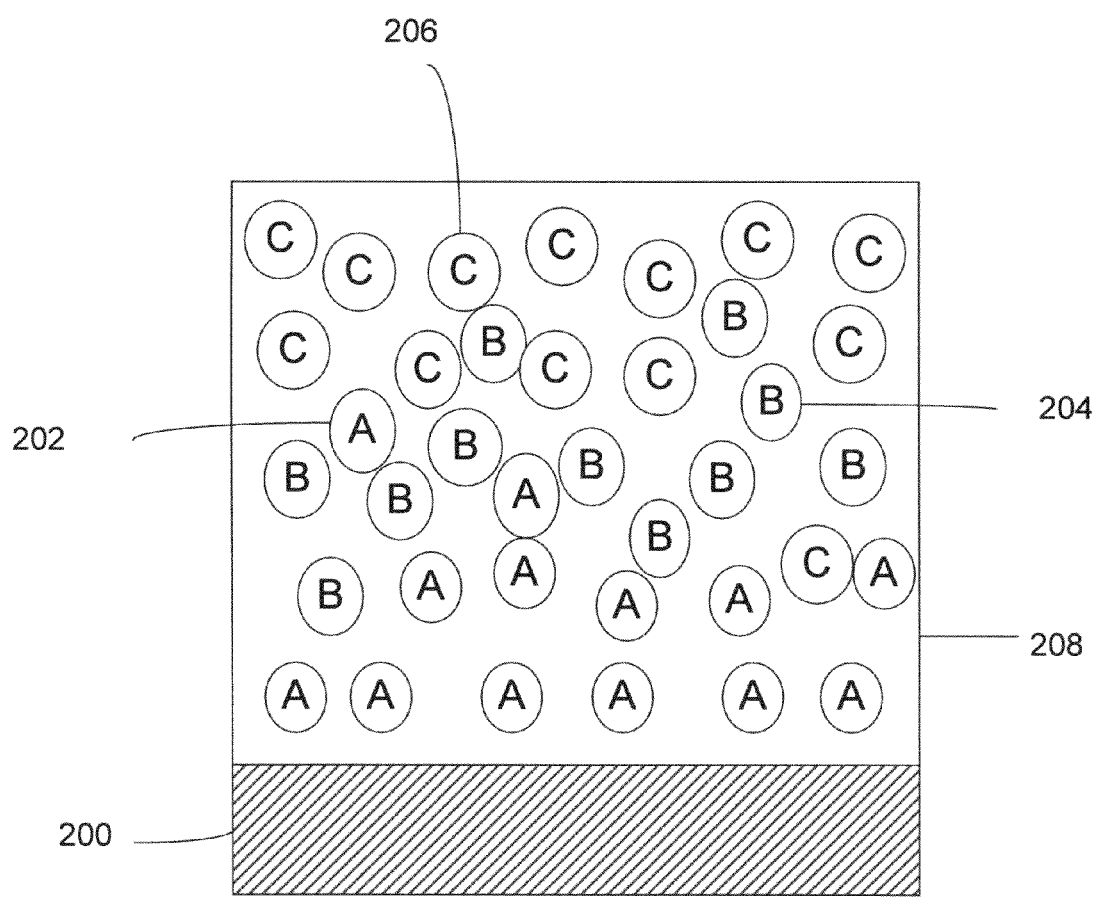
FIG. 2 is a schematic cross-sectional drawing of a single gradient layer protective coating on a polymer substrate.

FIG. 2 shows a single layer protective coating 208 on substrate 200. The single layer protective coating 208 comprises three components. Component A 202 contains organic material (e.g. $SiO_xC_yH_z$). Component B 204 contains inorganic material, such as ZnO which has UV blocking capability and higher refractive index of 1.9-2.0. Component C 206 contains inorganic material, such as $SiO_2$, $SiO_xN_y$ which have good scratch resistance. The substrate 200 comprises polymer such as polycarbonate. FIG. 2 also demonstrates that there may be a substantial variation in concentration of the three components in the single layer protective coating 208. Generally, the single layer protective coating 208 may contain any number of components. Such components may be mixed so that substantial variations may exist in concentrations of all components. The single protective layer coating 208 may provide protection for scratch resistance, WV light absorption, and an effective index matched to the substrate 200.

4. Exemplary Power Modulation

Figure 3A:
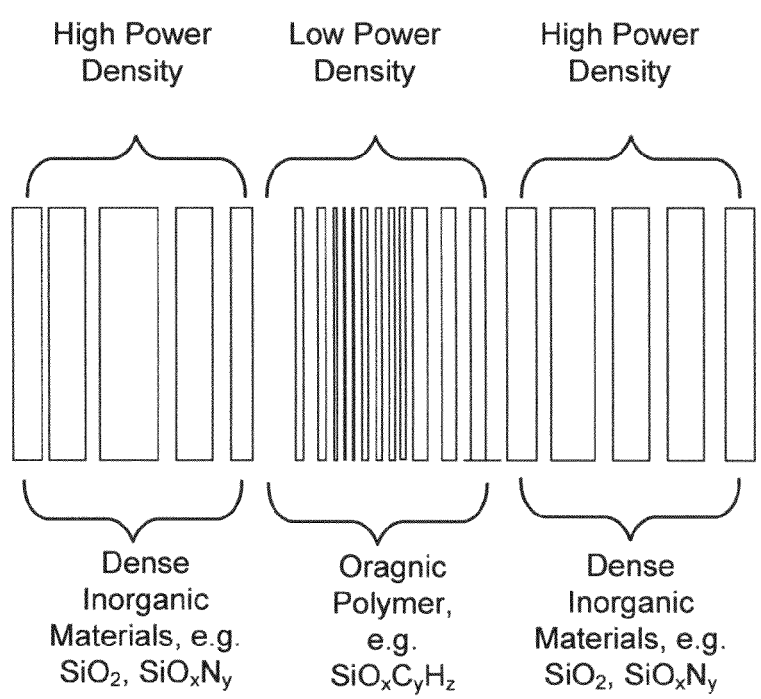
FIG. 3A shows an exemplary pulse width modulation over time.

There are many modulation technologies that control the radical densities and thus the chemical composition of deposited films. FIG. 3A shows a pulse width modulation (PWM) where the pulse amplitude remains constant, but the pulse width changes. FIG. 3A illustrates that when the pulse width is large, microwave power density is high so that a layer comprises high concentration of dense inorganic material such as $SiO_2$, $SiO_xN_y$, and ZnO or mixtures thereof. When the pulse width is small, microwave power density is lower so that a layer comprises lower concentration of inorganic material such as $SiO_2$, $SiO_xN_y$, and ZnO or mixtures thereof, but higher concentration of organo-silicon such as $SiO_xC_yH_z$.

Figure 3B:
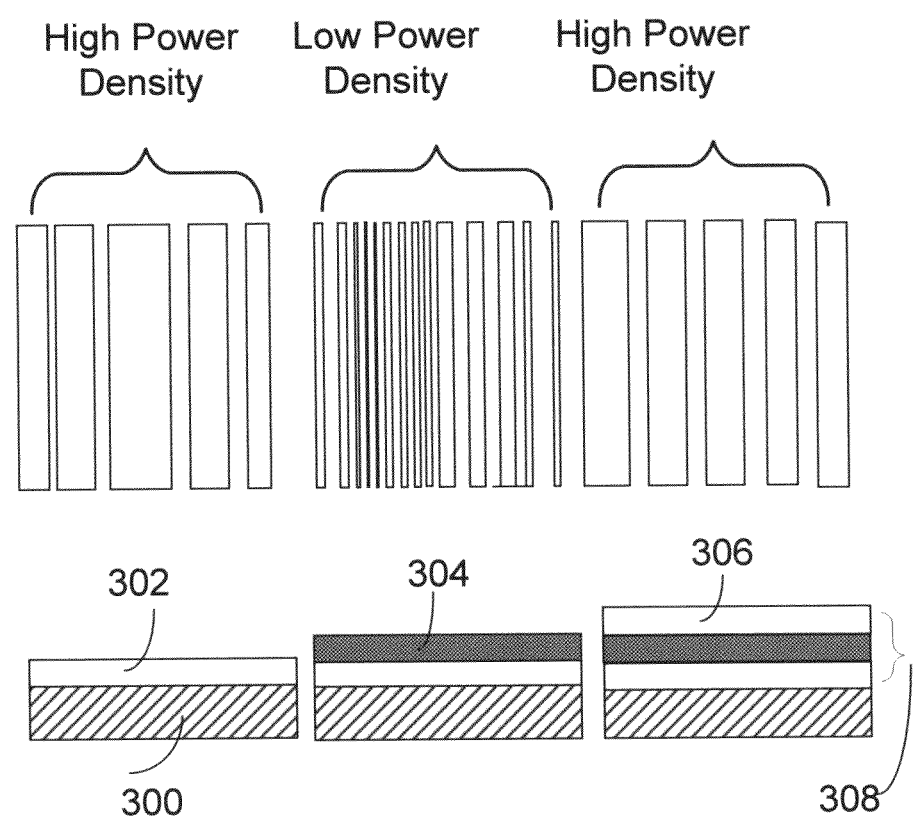
FIG. 3B shows an exemplary single gradient layer formed by a microwave pulse width modulation over time to control radical density.

FIG. 3B illustrates a multilayer structure 308 formed on a substrate 300 by using a pulse width modulation. Note that a first layer 302 disposed over the substrate 300 comprises mainly $SiO_2$, a second layer 304 disposed over the first layer 302 comprises preferably organic polymer, and a third layer 306 disposed over the second layer 304 comprises mainly $SiO_2$ again.

Figure 3C:
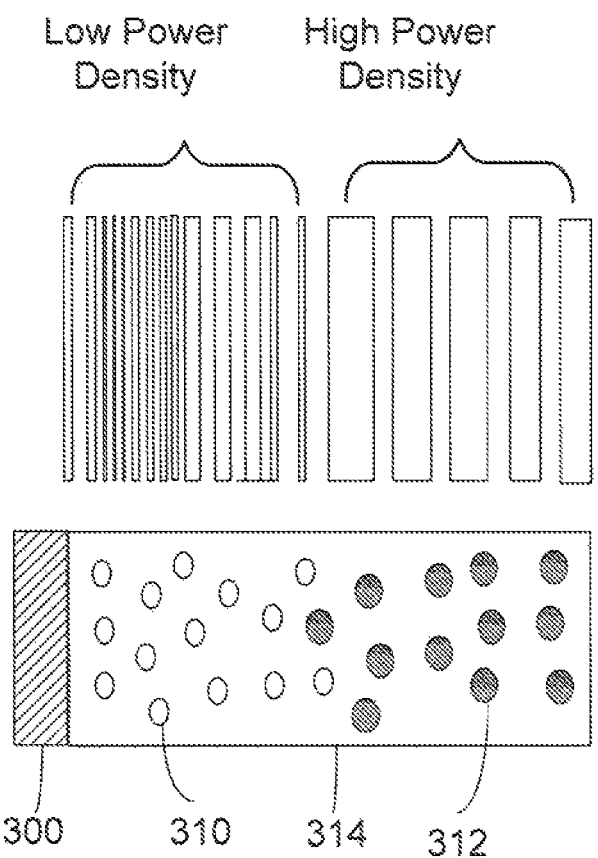
FIG. 3C shows an exemplary multilayer structure formed by a microwave pulse width modulation with interleaved layers containing organic polymer or inorganic component such as $SiO_2$, $SiO_xN_y$, or ZnO.

FIG. 3C illustrates a single layer 314 formed on a substrate 300 by using a pulse width modulation. Again, when a pulse width is large, power density is high so that higher concentration of dense inorganic material may be formed. Note that the single layer 314 may comprise components 310 and 312 with substantially continuous variations in concentrations, where component 310 may comprise organo-silicon polymer such as $SiO_xC_yH_z$, and component 312 may comprise dense inorganic material such as $SiO_2$. Furthermore, the single layer 314 may have higher concentration of the component 310 near the substrate, but higher concentration of component 312 near the top surface of the single layer 314.

Figure 4A:
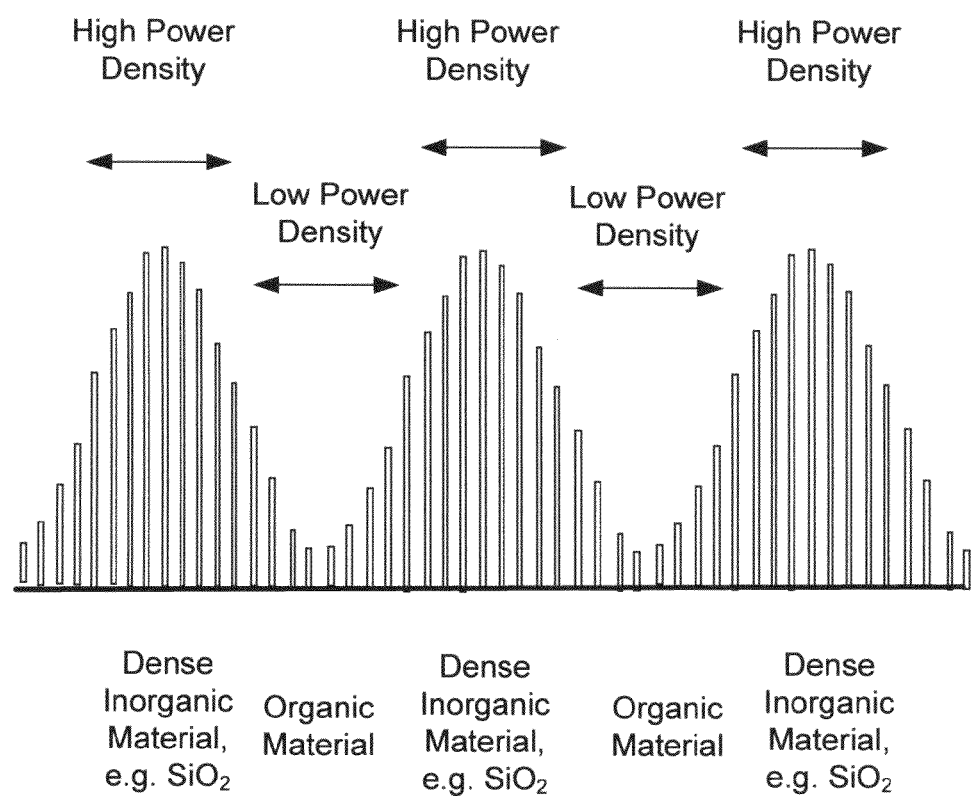
FIG. 4A shows an exemplary pulse amplitude modulation over time.

FIG. 4A shows a pulse amplitude modulation (PAM) where the pulse width remains constant, the pulse amplitude changes. Similarly, when the pulse amplitude is large, microwave power density is high so that the film comprises high concentration of inorganic material, such as $SiO_2$, $SiO_xN_y$, and ZnO, mixtures thereof. When the pulse amplitude is small, microwave power density is low so that the film comprises low concentration of inorganic material and high concentration of organic polymer such as $SiO_xC_yH_z$.

Figure 4B:
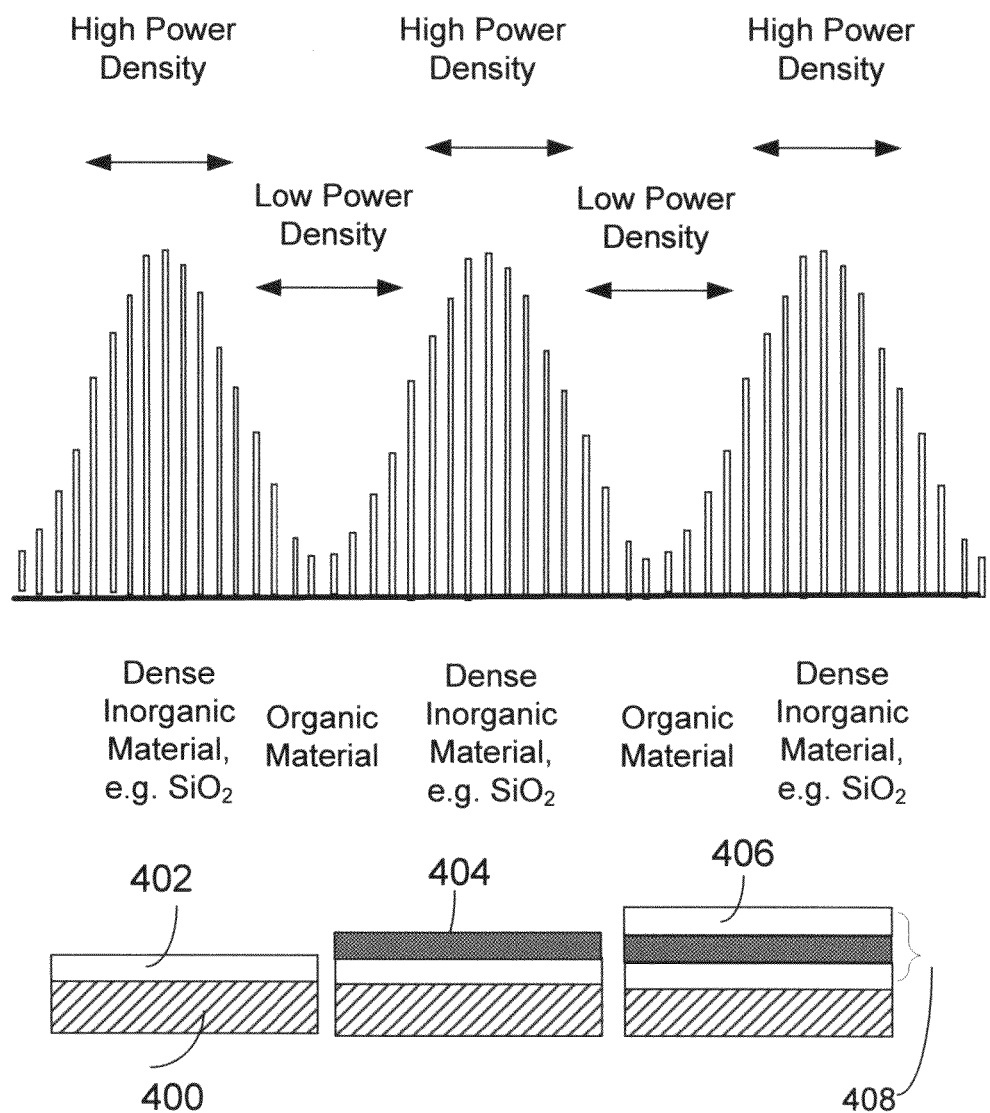
FIG. 4B shows an exemplary single gradient layer formed by a microwave amplitude modulation over time to control radical density.

FIG. 4B illustrates a multilayer structure 408 formed on a substrate 400 by using a pulse amplitude modulation. Note that a first layer 402 disposed over the substrate 400 comprises mainly $SiO_2$, a second layer 404 disposed over the first layer 402 comprises preferably organic polymer, and a third layer 406 disposed over the second layer 404 comprises mainly $SiO_2$ again.

Figure 4C:
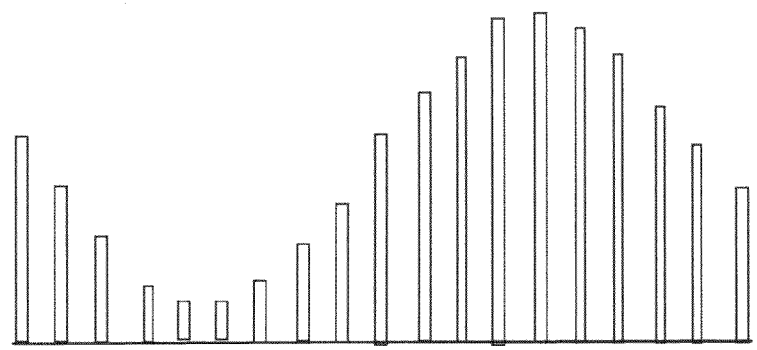
FIG. 4C shows a exemplary multilayer structure of interleaved organic polymer layer and inorganic layer such as $SiO_2$, $SiO_xN_y$, or ZnO formed by a microwave amplitude modulation over time to control radical density.
Figure 4C:
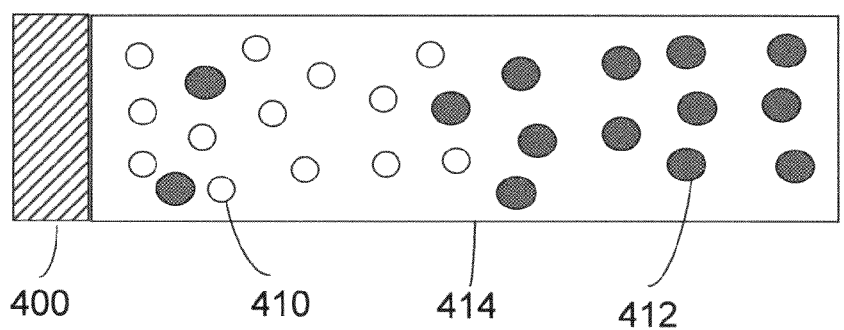

FIG. 4C illustrates a single layer 414 formed on a substrate 400 by using a pulse amplitude modulation. Note that the single layer 414 may comprise components 410 and 412 with substantially continuous variations in concentrations, where component 410 may comprise organo-silicon polymer such as $SiO_xC_yH_z$, and component 412 may comprise dense inorganic material such as $SiO_2$. Furthermore, the single layer 414 may have higher concentration of the component 410 near the substrate, but higher concentration of component 412 near the top surface of the single layer 414.

Figure 5:
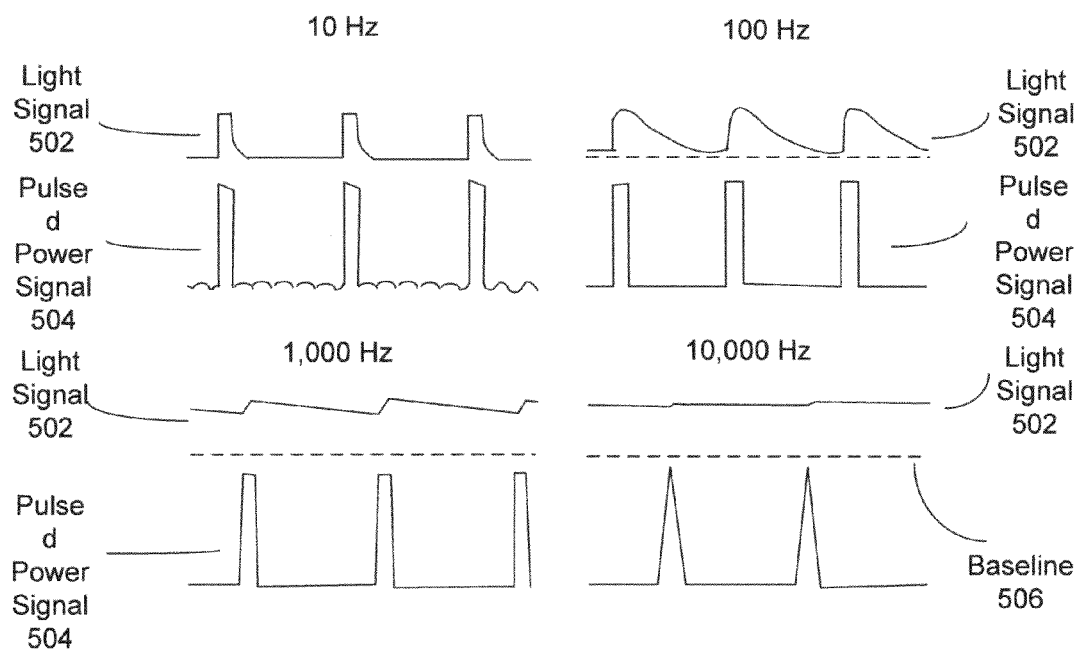
FIG. 5 illustrates the effect of pulsing frequency on the light signal from plasma.

Pulsing frequency may affect the microwave pulse power into plasma. FIG. 5 shows the frequency effect of the microwave pulse power 504 on the light signal of plasma 502. The light signal of plasma 502 reflects the average radical concentration. As shown in FIG. 5, at low pulsing frequency such as 10 Hz, in the event that all radicals are consumed, the light signal from plasma 502 decreases and extinguishes before the next power pulse comes in. As pulsing frequency increases to higher frequency such as 10,000 Hz, the average radical concentration is higher above the baseline 506 and becomes more stable.

One of the benefits for using a pulse modulation technique is that a single gradient protective coating or a multilayer protective coating may be formed by changing the microwave power over time without changing major processing parameters such as process pressure, flow rate and the like.

It should be understood that the simplified PWM and PAM are presented for illustrative purposes only. One of the ordinary skill in the art could implement any other modulation technique, including but not limited to frequency modulation, amplitude modulation of any waveform, and pulse position modulation.

5. Exemplary Deposition Process

Figure 6:
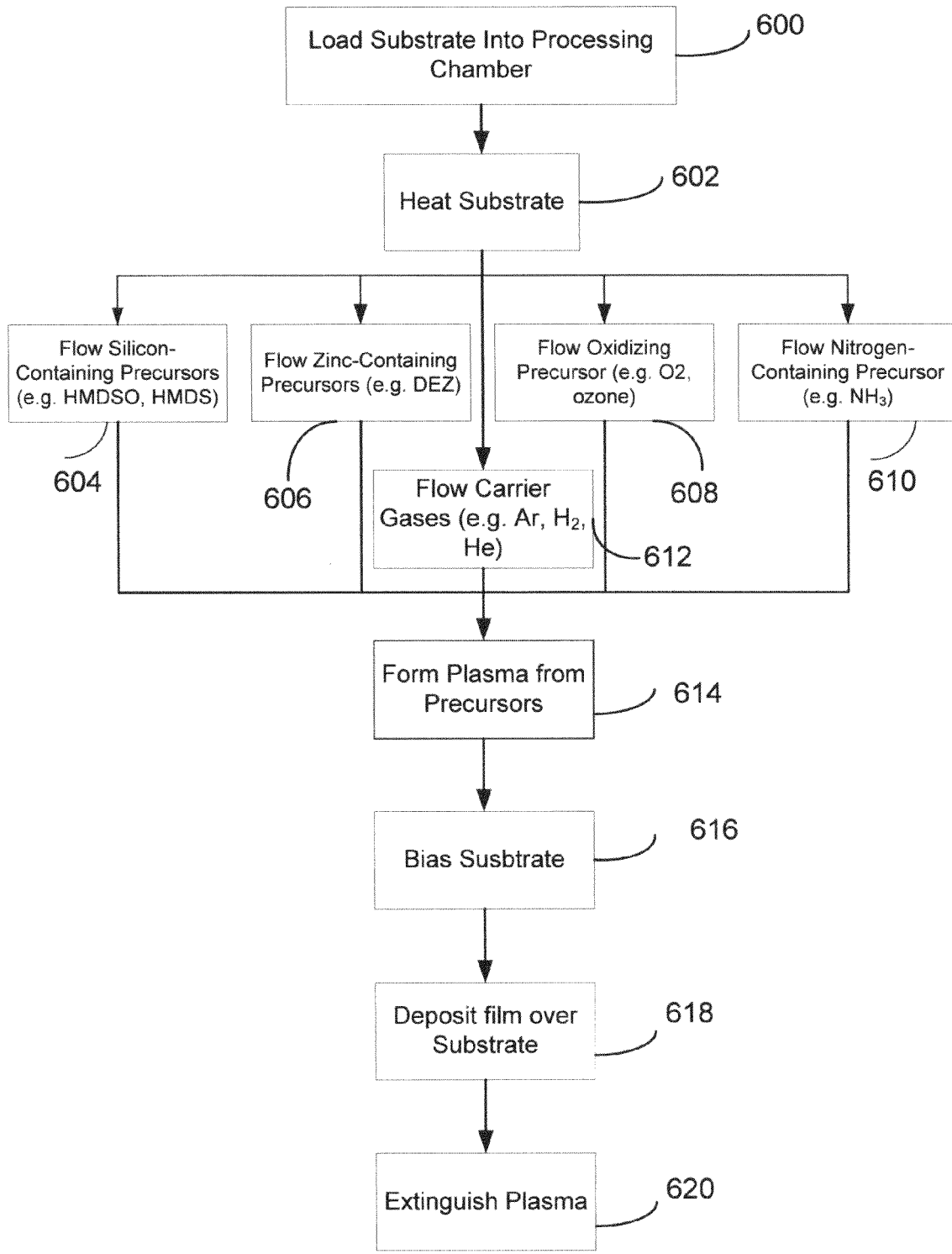
FIG. 6 is a flow chart depicting the process steps that may be included in forming protective coating on a substrate.

For purposes of illustration, FIG. 6 provides a flow diagram of a process that may be used to form a protective coating on a polymer substrate. The process begins with the substrate being loaded into a processing chamber as indicated at block 600. The substrate is then heated at block 602 to a low temperature (e.g. about 200° C. or less). Film deposition is initiated by flowing reactive precursor gases and carrier gases to the processing chamber at blocks 604, 606, 608, 610 and 612.

For deposition of $SiO_2$, such precursor gases may include a silicon-containing precursor such as hexamthyldisiloxane (HMDSO) and oxidizing precursor such as $O_2$. For deposition of $SiO_xN_y$, such precursor gases may include a silicon-containing precursor such as hexmethyldislanzane (HMDS), a nitrogen-containing precursor such as ammonia ($NH_3$), and an oxidizing precursor. For deposition of ZnO, such precursor gases may include a zinc-containing precursor such as diethylzinc (DEZ), and an oxidizing precursor such as oxygen ($O_2$), ozone ($O_3$) or mixtures thereof. The reactive precursors may flow through separate lines to prevent them from reacting prematurely before reaching the substrate. Alternatively, the reactive precursors may be mixed to flow through the same line.

The carrier gases may act as a sputtering agent. For example, the carrier gas may be provided with a flow of $H_2$ or with a flow of inert gas, including a flow of He or even a flow of a heavier inert gas such as Ar. The level of sputtering provided by the different carrier gases is inversely related to their atomic mass. Flow may sometimes be provided of multiple gases, such as by providing both a flow of $H_2$ and a flow of He, which mix in the processing chamber. Alternatively, multiple gases may sometimes be used to provide the carrier gases, such as when a flow of $H_2$/He is provided into the processing chamber.

As indicated at block 614, a plasma is formed from precursor gases by microwave at a frequency of 2.45 GHz. In some embodiments, the plasma may be a high-density plasma having an ion density that exceeds $10^{11}$ ions/cm$^3$. Also, in some instances the deposition characteristics may be affected by applying an electrical bias to the substrate. Application of such a bias causes the ionic species of the plasma to be attracted to the substrate, sometimes resulting in increased sputtering. The environment within the processing chamber may also be regulated in other ways in some embodiments, such as controlling the pressure within the processing chamber, controlling the flow rates of the precursor gases and where they enter the processing chamber, controlling the power used in generating the plasma, controlling the power used in biasing the substrate and the like. Under the conditions defined for processing a particular substrate, material is thus deposited over the substrate as indicated at block 618. After deposition is completed, the plasma is extinguished at block 620 and the substrate transferred out of the processing chamber 600.

6. Exemplary Deposition System

Figure 7:
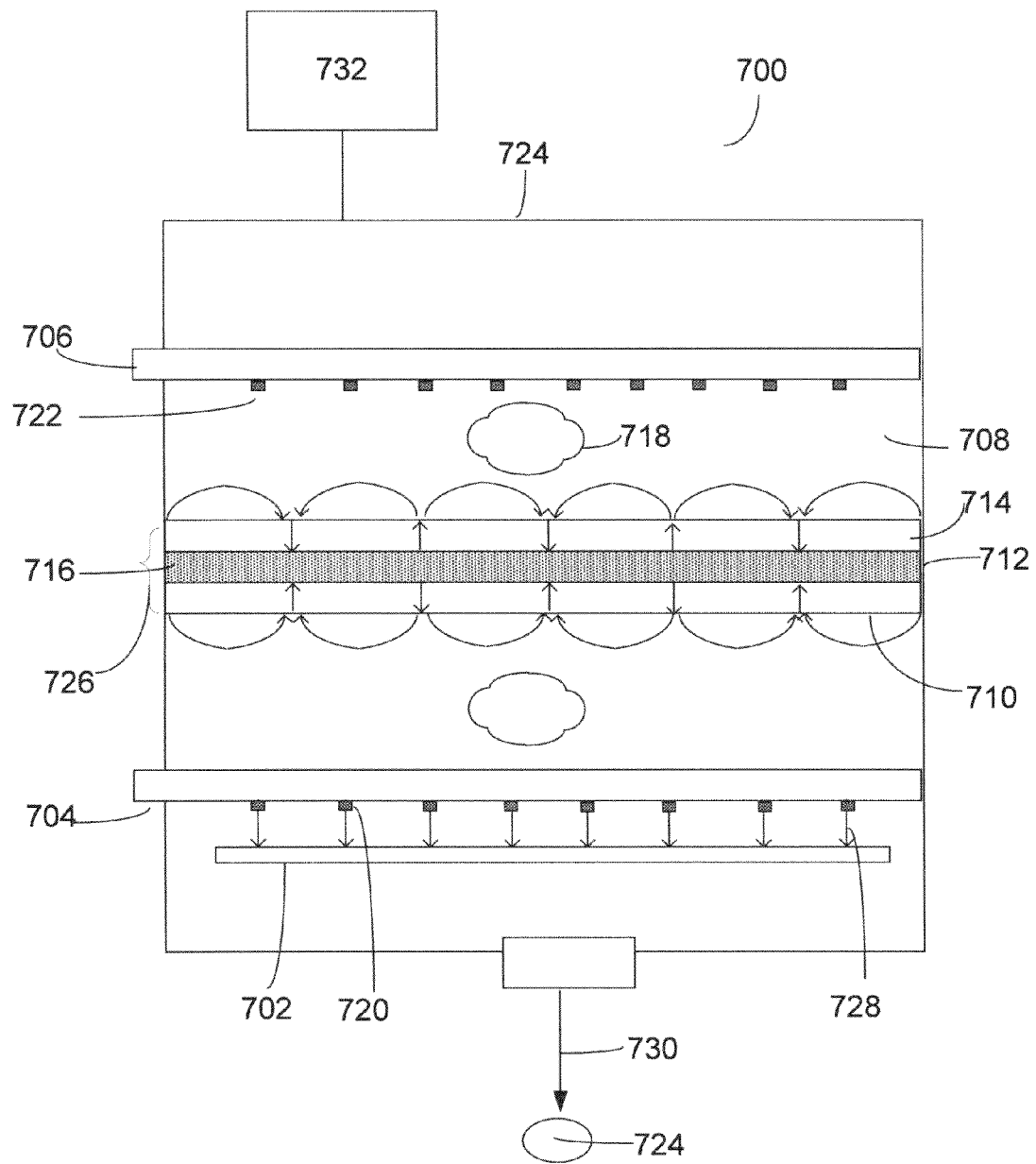
FIG. 7 is a simplified schematic representation of a coaxial plasma line MPCVD chamber for forming oxide layers and organic polymers on a substrate.

FIG. 7 is a simplified diagram of a coaxial microwave-assisted chemical vapor deposition (CVD) system 700 according to embodiments of the invention. Multiple-step processes can also be performed on a single substrate or wafer without removing the substrate from the chamber. The major components of the system include, among others, a processing chamber 724 that receives precursors from precursor gas line 704 and carrier gas line 706, a vacuum system 724, a coaxial microwave line source 726, a substrate 702, and a controller 732.

The coaxial microwave line source 726 includes, among others, an antenna 712, a microwave source 716 which inputs the microwave into the antenna 712, an outer envelope surrounding the antenna 712 made of dielectric material (e.g. quartz), which serves as a barrier between the vacuum pressure 708 and atmospheric pressure 714 inside the dielectric layer 710. The atmospheric pressure is needed for cooling the antenna 712. Electromagnetic waves are radiated into the chamber 724 through the dielectric layer 710 and plasma 718 may be formed over the surface of the dielectric material such as quartz. In a specific embodiment, the coaxial microwave line source 726 may be about 1 m long. An array of the line sources 626 may sometimes be used in the processing chamber 724.

The precursor gas line 704 may be located below the coaxial microwave line source 726 and above the substrate 702 which is near the bottom of the processing chamber 724. The carrier gas line may be located above the coaxial microwave source 726 and near the top of the processing chamber 724. Through the perforated holes 704 and 722, the precursor gases and carrier gases flow into the processing chamber 724. The precursor gases are vented toward the substrate 702 (as indicated by arrows 728), where they may be uniformly distributed radically across the substrate surface, typically in a laminar flow. After deposition is completed, exhaust gases exit the processing chamber 724 by using vacuum pump 724 through exhaust line 730.

The controller 732 controls activities and operating parameters of the deposition system, such as the timing, mixture of gases, chamber pressure, chamber temperature, pulse modulation, microwave power levels, and other parameters of a particular process.

While the above is a complete description of specific embodiments of the present invention, various modifications, variations and alternatives may be employed. Moreover, other techniques for varying the parameters of deposition could be employed in conjunction with the power modulation technique. Examples of the possible parameters to be varied include but are not limited to the temperature of deposition, the pressure of deposition, and the flow rate of precursors and carrier gases.

Having described several embodiments, it will be recognized by those of skill in the art that various modifications, alternative constructions, and equivalents may be used without departing from the spirit of the invention. Additionally, a number of well known processes and elements have not been described in order to avoid unnecessarily obscuring the present invention. Accordingly, the above description should not be taken as limiting the scope of the invention.

7. Exemplary Ceramic $SiO_2$ and Polymer-Like $SiO_2$ Films

A few analytical techniques are briefly described here, and may be used to characterize the films formed from the process in accordance with the present invention.

Figure 8A:
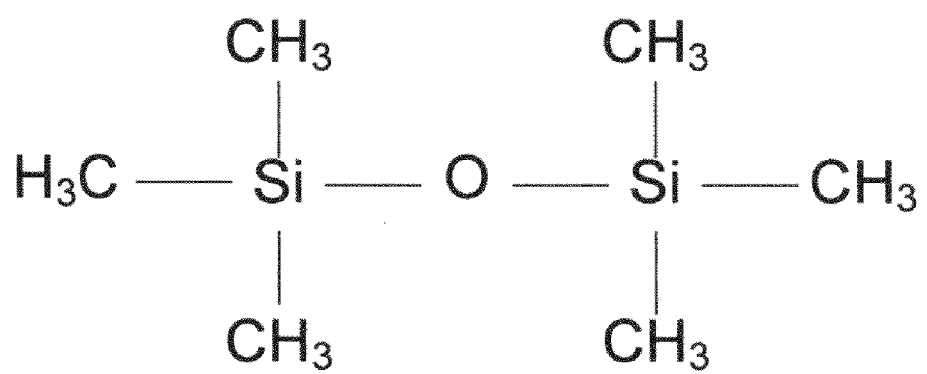
FIG. 8A shows a chemical structure of HMDSO.
Figure 8B:
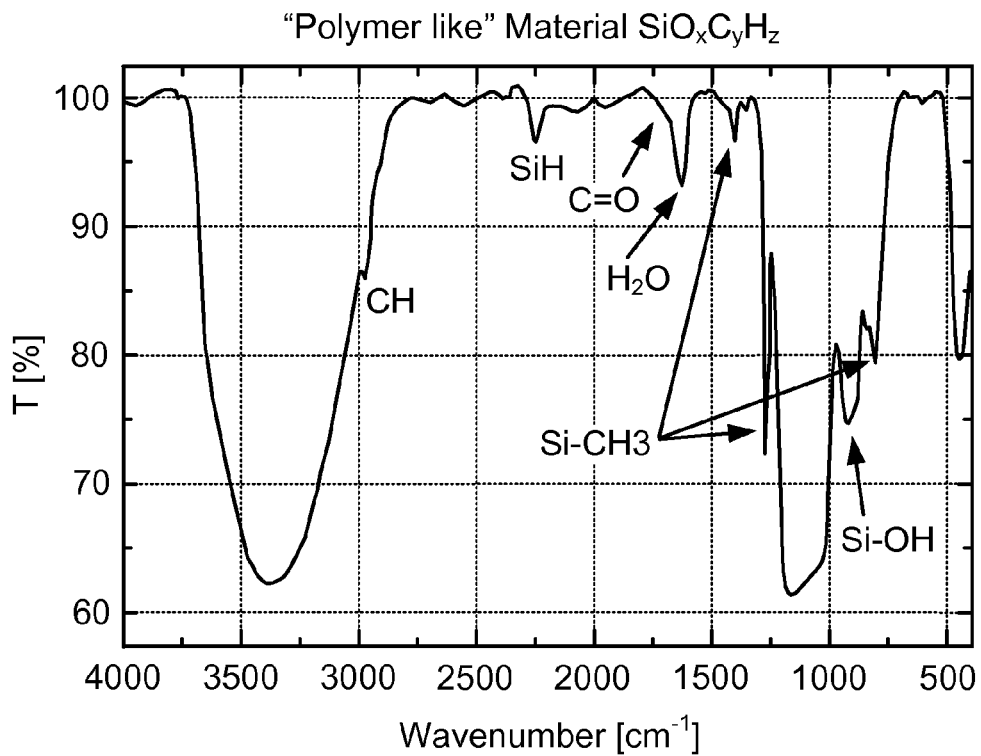

Fourier Transform Infrared spectroscopy (FTIR) is commonly used to identify organic compounds or polymers based upon a group of peaks detected. FIGS. 8A-8B show the FTIR spectra for two types of $SiO_2$ formed from precursors HMDSO and $O_2$ by using pulse modulation in MPCVD, i.e. ceramic $SiO_2$ film and polymer-like $SiO_2$ film. The chemical structure of HMDSO is provided in FIG. 8A. As shown in FIG. 8B, the FTIR peaks indicate the presence of CH bond, SiH bond, Si—$CH_3$ functional group, and Si—OH bond. With the detected peaks, the chemical is identified as $SiO_x$-

Figure 8C:
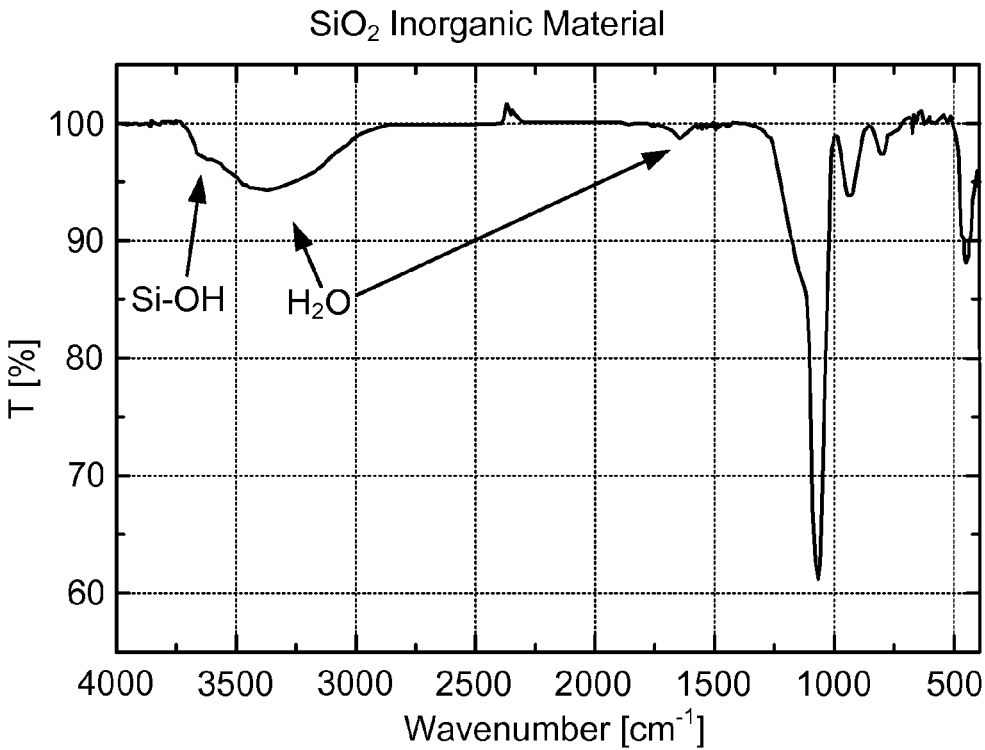

$C_yH_z$. FIG. 8C shows the FTIR spectrum of $SiO_2$ where fewer peaks are observed than in FIG. 8B.

The inventors have performed a number of experiments to demonstrate that the coaxial microwave line source is suitable for depositing dense film at high deposition rate (e.g. >3 μm/min), such as amorphous and microcrystalline silicon, $SiO_2$, $SiO_x$, $SiN_x$, $SiO_xN_y$, diamond and the like. The gradient films of $SiO_2$, $SiO_x$, $SiN_x$, $SiO_xN_y$ may be formed by using the microwave pulsing modulation technology according to embodiments of the invention. The inventors have also demonstrated that highly scratch resistant $SiN_x$ is successfully deposited on polycarbonate substrate without poor film adhesion problem.

Figure 9A:
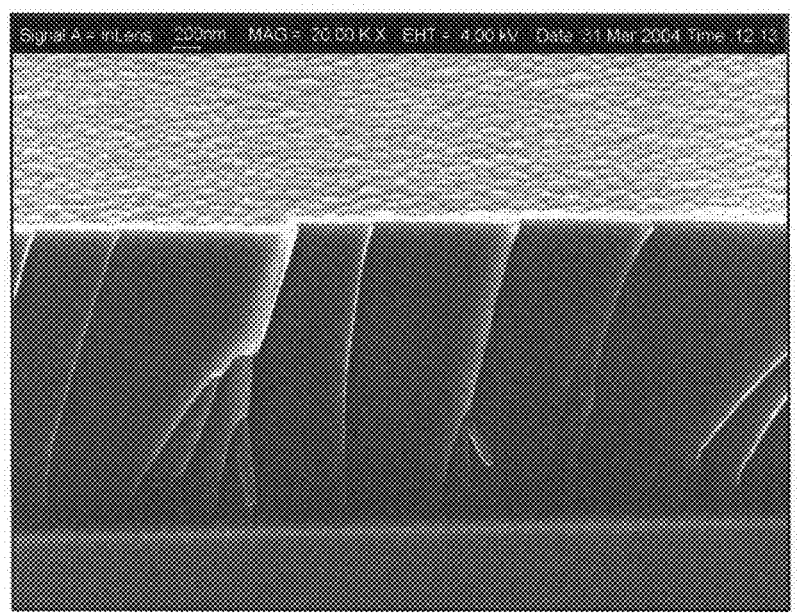
FIGS. 9A-9B show a SEM image and XPS spectrum of deposited $SiO_2$ thin film in accordance with the present invention.
Figure 9B:
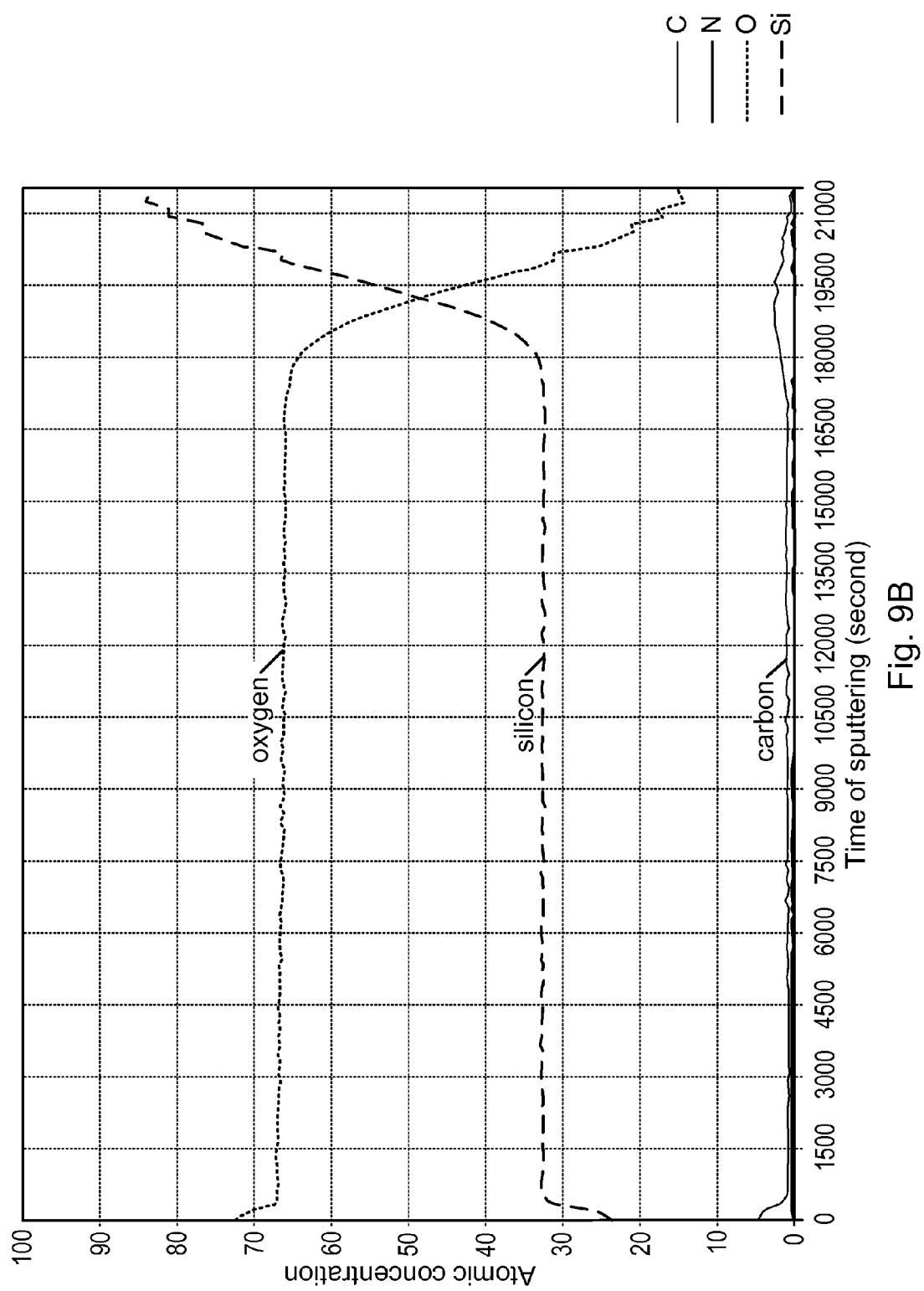

FIG. 9 provides a scanning electron microscope (SEM) image and X-ray photoelectron spectroscopy (XPS) spectrum of a ceramic $SiO_2$ thin film. XPS is also called electron spectroscopy for chemical analysis (ESCA), and is a surface analysis technique. It can measure the elemental composition of the surface to a depth of about 50-100 Å. By sputtering, depth profiles of all detectable elements can be obtained to show the elemental composition variation in deposited film. FIG. 9B shows that the silicon and oxygen content remain approximately constant until the time of sputtering reaches 18,000. Then, the silicon content increases significantly while the oxygen content decreases sharply, and the carbon content increases. This indicates the presence of $SiO_2$ layer up to a sputtering time of 18,000 and the transition to a new layer near the sputtering time of 18,000. With the surface analysis technique described, the depth profile of any film formed in accordance to the present invention can be characterized, for example to show a gradient in elemental composition.

Figure 10A:
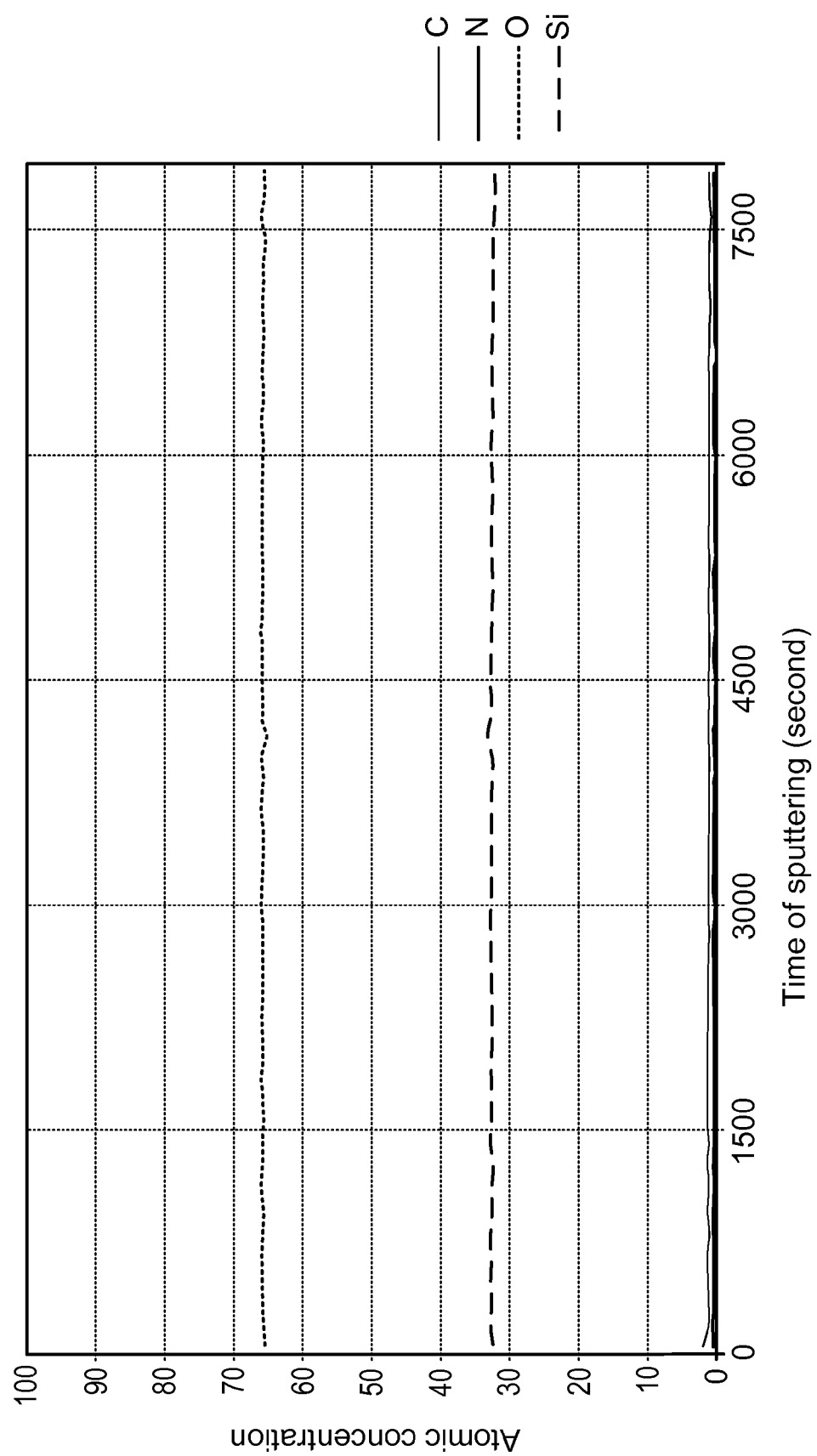
FIGS. 10A-10C provide the XPS depth profile of deposited film $SiO_2$ in accordance with the present invention, the refractive index and optical transmission of a 5 μm thickness film.
Figure 10B:
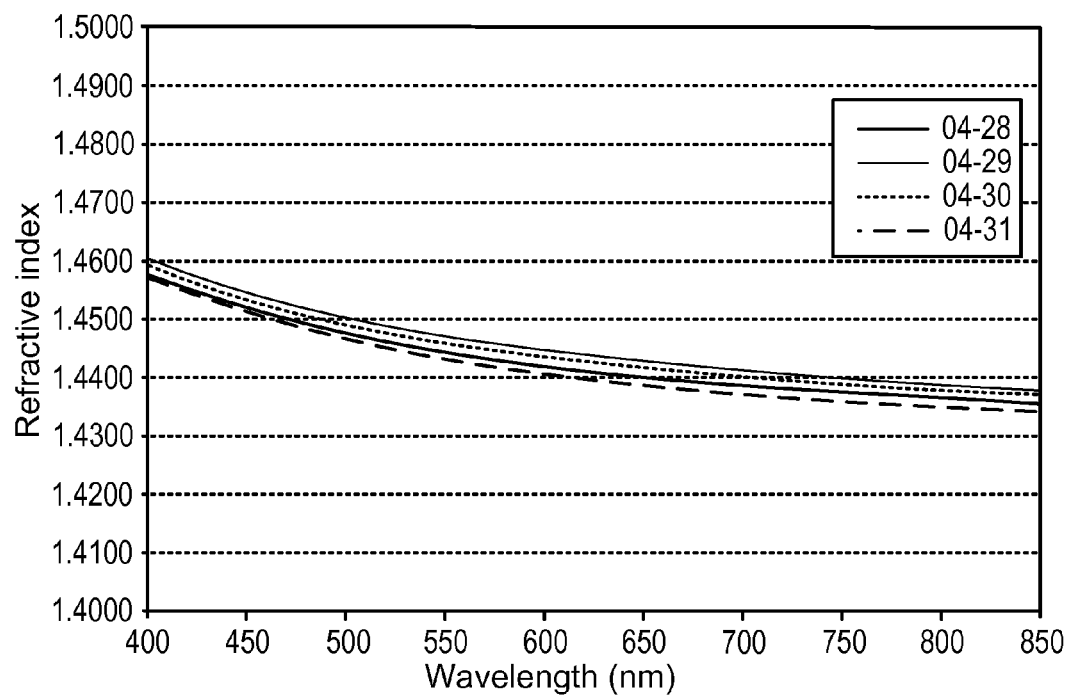
Figure 10C:
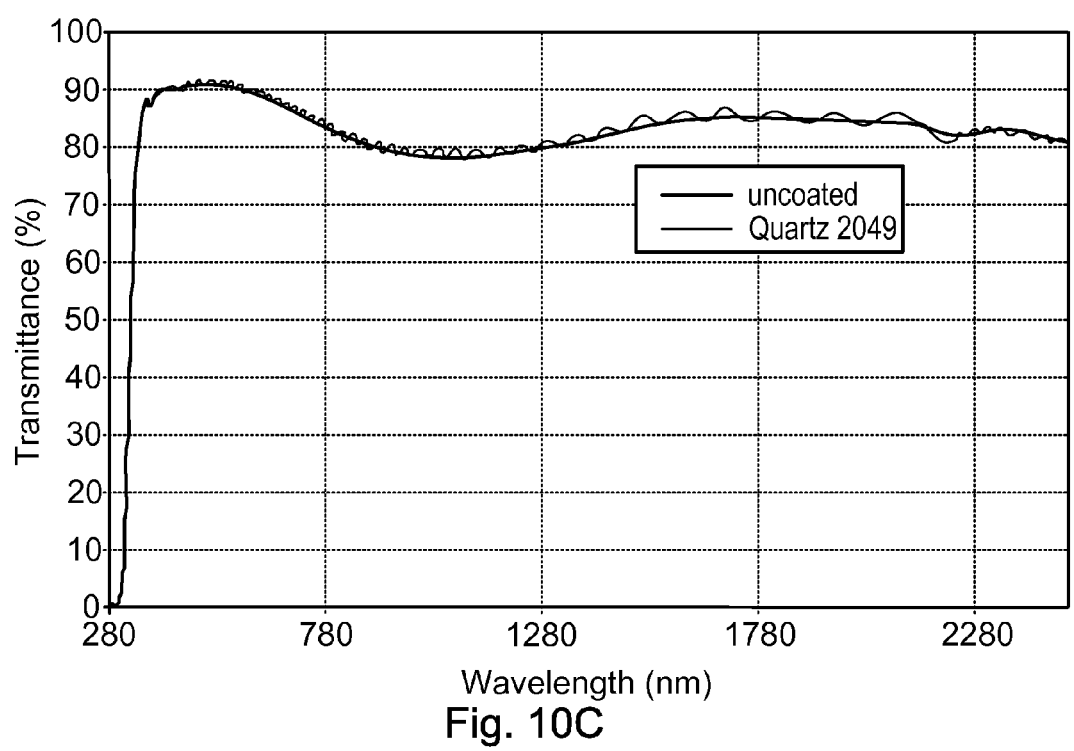

Referring now to FIG. 10A, the XPS depth profile indicates that the deposited layer is $SiO_2$. FIG. 10B illustrates that the deposited dielectric layer has a refractive index of about 1.43-1.46 depending upon wavelength. FIG. 1C shows that the deposited $SiO_2$ layer has an optical transmission between 80% and 90% varying with wavelength. This technique can be used to characterize the coating and to verify if the coating has the desired optical transparency, for example, the protective coating comprising ZnO with at least one of $SiO_2$ and $SiO_xN_y$ and having a matched effective refractive index to polycarbonate substrate. Such a protective coating may have scratch resistance, UV light resistance and may be optically transparent.

Furthermore, other techniques may be used in material characterization. For example, X-ray diffraction technique can be used for verifying the structure of deposited film such as the diamond structure. Raman spectroscopy can be used to distinguish amorphous silicon and microcrystalline silicon.

Those of ordinary skill in the art will realize that specific parameters can vary for different processing chambers and different processing conditions, without departing from the spirit of the invention. Other variations such as structure of the protective coating, material components, reactive precursor gases, will also be apparent to persons of skill in the art. These equivalents and alternative are intended to be included within the scope of the present invention. Therefore, the scope of this invention should not be limited to the embodiments described, but should instead be defined by the following claims.

What is claimed is:

1. A multilayer protective coating on a polymer substrate for providing both UV light absorption and scratch resistance, the coating comprising:
   a first layer of a first component, wherein:
      said first layer is disposed over said polymer substrate;
      the first component comprises a first concentration of organic material having a first refractive index; and
      the first layer has a substantially continuous variation in material concentration of the first component across the first layer; and
      the first concentration is greater than 60%;
   a second layer of a second component, wherein:
      said second layer is disposed over said first layer;
      the second component comprises a second concentration of a mixture of inorganic materials having a second refractive index;
      the second layer has a substantially continuous variation in material concentration of the second component across the second layer; and
      the second refractive index is higher than the first refractive index;
      the second concentration is greater than 60%.

2. The multilayer protective coating of claim 1, wherein an effective refractive index of the multilayer protective coating is matched with a refractive index of said polymer substrate.

3. The multilayer protective coating of claim 1, wherein a thickness of the first layer is less than 5 Å and a thickness of the second layers is less than 5 Å.

4. The multilayer protective coating of claim 1, comprising a plurality of such first layers interleaved with a plurality of such second layers, wherein the number of such first layers and of such second layers is between 2 and 100,000.

5. The multilayer protective coating of claim 1, wherein the inorganic material comprises ZnO with at least one of $SiO_2$ or $SiO_xN_y$.

6. The multilayer protective coating of claim 1, wherein the organic material comprises organo-silicon polymer.

7. The multilayer protective coating of claim 6, wherein the organo-silicon polymer comprises $SiO_xC_yH_z$.

8. The multilayer protective coating of claim 1, wherein said polymer substrate comprises polycarbonate.

9. A single protective layer on a polymer substrate for providing both UV light absorption and scratch resistance, the layer comprising a mixture of a first component and a second component disposed over said polymer substrate; wherein:
   the first component comprises a first concentration of organic material having a first refractive index and a first thickness;
   the second component comprises a second concentration of inorganic material having a second refractive index and a second thickness;
   the first concentration has a substantially continuous variation across a first distance away from the substrate surface;
   the second concentration has a substantially continuous variation across a second distance away from the substrate surface;
   the first refractive index is lower than the second refractive index;
   the first and second concentrations are greater than 60%; and
   the first thickness is approximately equal to the second thickness.

10. The single protective layer of claim 9, wherein the single protective layer has an effective refractive index matched with a refractive index of said polymer substrate.

11. The single protective layer of claim 9, wherein the first concentration substantially decreases with a distance away from the substrate surface adjacent to the protective layer and the second concentration substantially increases with a distance away from the substrate surface adjacent to the protective layer.

12. The single protective layer of claim 9, wherein the inorganic material comprises ZnO with at least one of $SiO_2$ or $SiO_xN_y$.

13. The single protective layer of claim 9, wherein the organic material comprises organo-silicon polymer.

14. The single protective layer of claim 13, wherein the organo-silicon polymer comprises $SiO_xC_yH_z$.

15. The single protective layer of claim 9, wherein said polymer substrate comprises polycarbonate.

16. A microwave plasma assisted CVD process for forming a multilayer protective coating over a polymer substrate, the process comprising:
   providing a modulated microwave plasma source for controlling plasma radical concentration so that material composition may be varied by changing microwave power over time, wherein the protective layer comprises:
     a plurality of first layers having a first concentration of organic material; and
     a plurality of second layers having a second concentration of inorganic material disposed over the first layers whereby the first and second layers are interleaved and at least one of the first and second layers is disposed over said polymer substrate;
   providing a continuous flow of a group of precursors to a chamber housing a substrate, wherein said precursors are selected from the group consisting of a first and a second silicon-containing precursor, a zinc-containing precursor, an oxidizing precursor, and a nitrogen-containing precursor; and
   causing reactions among precursors to form oxides and organic polymers.

17. The microwave plasma assisted CVD process of claim 16, wherein the first silicon-containing precursor comprises hexamethyldisiloxane (HMDSO).

18. The microwave plasma assisted CVD process of claim 16, wherein the second silicon-containing precursor comprises hexamethyldisilazane (HMDS).

19. The microwave plasma assisted CVD process of claim 16, wherein the nitrogen containing precursor comprises ammonia ($NH_3$).

20. The microwave plasma assisted CVD process of claim 16, wherein the zinc-containing precursor comprises diethylzinc (DEZ).

21. The microwave plasma assisted CVD process of claim 16, the process comprising:
   causing a reaction between the first silicon-containing precursor and the oxidizing precursor to form a silicon oxide layer;
   causing a reaction among the second silicon-containing precursor, the nitrogen-containing precursor, and the oxidizing precursor to form a silicon oxynitride layer; and
   causing a reaction between the zinc-containing precursor and the oxidizing precursor to form a zinc oxide layer.

22. The microwave plasma assisted CVD process of claim 16, wherein the microwave plasma source is modulated by a waveform to allow power variation over time.

23. The microwave plasma assisted CVD process of claim 16, wherein:
   a microwave pulse amplitude is modulated by a waveform;
   a first layer having a first concentration of organic material is disposed over said polymer substrate at a first microwave power;
   a second layer having a second concentration of inorganic material is disposed over the first layer at a second microwave power;
   the first microwave power is lower than the second microwave power; and
   the first and second concentrations are greater than 60%.

24. The microwave plasma assisted CVD process of claim 16, wherein:
   a microwave power pulse width is modulated by a waveform;
   a first layer having a first concentration of organic material is disposed over said polymer substrate during a microwave power pulse off time with a first thickness;
   a second layer of a second concentration of inorganic material is disposed over the first layer during a microwave power pulse on time with a second thickness;
   the first layer has a substantially continuous variation in concentration across the first layer; and
   the second layer has a substantially continuous variation in concentration across the second layer; and
   the first and second concentrations are greater than 60%.

25. The microwave plasma assisted CVD process of claim 16, wherein the first and second thicknesses are less than 5 Å.

26. The microwave plasma assisted CVD process of claim 16, wherein:
   the inorganic material comprises ZnO with at least one of $SiO_2$ and $SiO_xN_y$; and
   the organic material comprises oragno-silicon polymer.

27. A microwave plasma assisted CVD process for forming a single protective layer over a polymer substrate, the process comprising:
   providing a modulated microwave plasma source for controlling plasma radical concentration such that material composition may be varied by changing microwave power over time, wherein:
     the protective layer comprises a single layer of a mixture of a first component and a second component;
     the first component comprises a first concentration of organic material with a substantially continuous variation in concentration within the single layer;
     the second component comprises a second concentration of inorganic material with a substantially continuous variation in concentration within the single layer;
   providing a continuous flow of a group of precursors to a chamber housing a substrate, wherein said precursors are selected from the group consisting of a first and a second silicon-containing precursor, a zinc-containing precursor, an oxidizing precursor, and a nitrogen-containing precursor; and
   causing reactions among said precursors to form oxides and organic polymers.

28. The microwave plasma assisted CVD process of claim 27, wherein the first silicon-containing precursor comprises hexamethyldisiloxane (HMDSO).

29. The microwave plasma assisted CVD process of claim 27, wherein the second silicon-containing precursor comprises hexamethyldisilazane (HMDS).

30. The microwave plasma assisted CVD process of claim 27, wherein the nitrogen containing precursor comprises ammonia ($NH_3$).

31. The microwave plasma assisted CVD process of claim 27, wherein the zinc-containing precursor comprises diethylzinc (DEZ).

32. The microwave plasma assisted CVD process of claim 27, the process comprising:

causing a reaction between the first silicon-containing precursor and the oxidizing precursor to form a silicon oxide layer;

causing a reaction among the second silicon-containing precursor, the nitrogen-containing precursor, and the oxidizing precursor to form a silicon oxynitride layer; and causing a reaction between the zinc-containing precursor and the oxidizing precursor to form a zinc oxide layer.

33. The microwave plasma assisted CVD process of claim 27, wherein the microwave plasma source is modulated by a waveform to allow power variation over time.

34. The microwave plasma assisted CVD process of claim 27, the single protective layer disposed over said polymer substrate comprising a first component and a second component wherein:

the first component has a first concentration of inorganic material;

the second component has a second concentration of organic material; and the first and second concentrations have substantial variations across the single layer.

35. The microwave plasma assisted CVD process of claim 34, wherein:

the inorganic material comprises ZnO with at least one of $SiO_2$ and $SiO_xN_x$; and the organic material comprises oragno-silicon polymer.

* * * * *